(12) United States Patent
Kwak (10) Patent No.: US 7,709,948 B2
(45) Date of Patent: May 4, 2010

(54) ORGANIC LIGHT-EMITTING DISPLAY DEVICE

(75) Inventor: Won Kyu Kwak, Seongnam-si (KR)

(73) Assignee: Samsung Mobile Display Co., Ltd. (KR)

( * ) Notice: Subject to any disclaimer, the term of this patent is extended or adjusted under 35 U.S.C. 154(b) by 421 days.

(21) Appl. No.: 11/540,382

(22) Filed: Sep. 29, 2006

(65) Prior Publication Data
US 2009/0167155 A1 Jul. 2, 2009

(30) Foreign Application Priority Data
Jan. 26, 2006 (KR) ............ 10-2006-0008461
Feb. 20, 2006 (KR) ............ 10-2006-0016187

(51) Int. Cl.
*H01L 23/04* (2006.01)
(52) U.S. Cl. .......... 257/698; 257/690; 257/99; 257/E23.193
(58) Field of Classification Search ........ 257/99, 257/692, 770, 773, 506, 509, 698, E23.193
See application file for complete search history.

(56) References Cited
U.S. PATENT DOCUMENTS
4,238,704 A   12/1980   Bonk et al.
6,111,357 A   8/2000   Fleming et al.
6,320,251 B1 * 11/2001 Glenn ............... 257/678
6,555,025 B1   4/2003   Krupetsky et al.
2004/0207314 A1 10/2004 Aitken et al.
2005/0218396 A1 * 10/2005 Tsuchiya et al. ....... 257/13

FOREIGN PATENT DOCUMENTS
EP   0971564       1/2000
JP   09-278483    10/1997
JP   10-074583     3/1998
JP   2000-036381   2/2000

\* cited by examiner

*Primary Examiner*—Lex Malsawma
*Assistant Examiner*—Robert Huber
(74) *Attorney, Agent, or Firm*—Knobbe Martens Olson & Bear LLP (57) ABSTRACT

Disclosed is an organic light-emitting display device preventing an infiltration of oxygen, moisture, etc. The organic light-emitting display device of the present invention comprises: a first substrate comprising a pixel region wherein a pixel is formed and a non-pixel region excepting the pixel region; a second substrate opposed and bonded to the first substrate in one region comprising the pixel region; a frit positioned between the non-pixel region and the second substrate to bond the first substrate and the second substrate; and at least one metal line formed on the first substrate to be overlapped with a portion of the frit, wherein the side of the metal line is bent and formed at a predetermined angle in the intersecting region overlapped with the frit.

23 Claims, 11 Drawing Sheets

ORGANIC LIGHT-EMITTING DISPLAY DEVICE

CROSS-REFERENCE TO RELATED APPLICATIONS

This application claims the benefit of the earlier filing dates of Korean Patent Application Nos. 10-2006-0008461, filed on Jan. 26, 2006 and 10-2006-0016187, filed on Feb. 20, 2006, in the Korean Intellectual Property Office, which are incorporated herein by reference in their entirety.

BACKGROUND

1. Field

The present invention relates to display technologies, and more particularly to an organic light-emitting display device.

2. Discussion of Related Technologies

In general, an organic light-emitting display device comprises a first substrate, and a second substrate opposing the first substrate and a sealing structure. The sealing structure combines the first and second substrates, which in combination form an enclosed space. The sealing structure often is made of a material such as epoxy. The organic light-emitting display device further includes an array of organic light-emitting diodes within the enclosed space.

However, since the organic light-emitting diodes include organic materials, it may be vulnerable to moisture. Further, since one or more electrically conductive lines formed in the array are made of metallic materials, the lines may be easily oxidized by oxygen contained in the air, which can deteriorate their electrical characteristics and light-emitting characteristics of the display device. To prevent this, moisture absorbent can be mounted within the enclosed space as an approach.

However, mounting the moisture absorbent in the display device is not without problems. As an alternative or in addition, more hermetic sealing can be introduced using glass frit substituting a conventional sealant. U.S. Pat. No. 6,998,776 discloses glass frit to encapsulate an organic light-emitting device.

SUMMARY OF THE INVENTION

One aspect of the invention provides an organic light-emitting display device. The device comprises: a first substrate; a second substrate; a frit seal interconnecting the first and second substrate; and an electrically conductive line formed on the first substrate and comprising a portion overlapping with the frit seal, wherein the portion of the electrically conductive line comprises a first edge with geometrical structures such that the length along the first edge with the geometrical structures is substantially longer than that without the geometrical structures, wherein the electrically conductive line comprises a first side surface depending from the first edge, the first side surface comprising a groove extending along at least part of the first edge. In the device, the first substrate may consist of a single layer. Alternatively, the first substrate may comprise a plurality of layers.

The first substrate, the second substrate and the frit seal may define an enclosed space, wherein the electrically conductive line interconnects a first circuit located within the enclosed space and a second circuit located outside the enclosed space. The groove may extend substantially throughout along the first edge of the portion. The frit seal and the grooved first side surface of the portion may form a passage configured to pass moisture therethrough. The passage may interconnect the enclosed space and outside the enclosed space. The groove may be substantially curved.

The portion may further comprise a second edge generally parallel to the first edge, wherein the second edge comprises geometrical structures such that the length along the second edge with the geometrical structures is substantially longer than that without the geometrical structures, wherein the electrically conductive line comprises a second side surface depending from the second edge, the second side surface comprising a groove extending along at least part of the second edge.

The geometrical structures may comprise at least one of a protrusion and a recess. The geometrical structures may provide a plurality of turns along the edge. The geometrical structures may comprise a protrusion from the first side surface and an extension from the protrusion, and the extension may extend in a direction substantially parallel to the portion of the electrically conductive line. The extension may be longer than the protrusion in the direction.

The geometrical structures may comprise a recess into the first side surface and a canal extending from the recess, wherein the canal extends in a direction substantially parallel to the portion of the electrically conductive line, wherein the canal is longer than the recess in the direction. At least one of the geometrical structures may comprise a groove on a side surface thereof.

The electrically conductive line may comprise two or more layers. The electrically conductive line may comprise an interposed layer interposed between two conductive layers, wherein the groove is formed into the interposed layer. Each of the two conductive layers may comprise a common material. The electrically conductive line may comprise a layered structure of titanium (Ti)/aluminum (Al)/titanium (Ti) or molybdenum (Mo)/aluminum (Al)/molybdenum (Mo). The electrically conductive line may not comprise through holes therein.

The frit seal may contact at least part of the first side surface. The frit seal may comprise a portion partly received in the groove. The frit seal may comprise a portion blocking a portion of the groove.

Another aspect of the invention provides a method of making an organic light-emitting display device. The method comprises: providing a first substrate and an electrically conductive line formed on the first substrate; providing a second substrate; and interconnecting the first and second substrates with a frit seal interposed therebetween; wherein the electrically conductive line comprises a portion overlapping with the frit seal, wherein the portion of the electrically conductive line comprises a edge with geometrical structures such that the length along the edge with the geometrical structures is substantially longer than that without the geometrical structures, wherein the electrically conductive line comprises a side surface depending from the edge, the side surface comprising a groove extending along at least part of the edge. The frit seal and the grooved side surface of the portion may form a passage.

According to one embodiment of the present invention, the organic light-emitting display device comprises: a first substrate comprising a pixel region wherein a pixel is formed and a non-pixel region excepting the pixel region; a second substrate opposed and bonded to the first substrate in one region comprising the pixel region; a frit positioned between the non-pixel region and the second substrate to bond the first substrate and the second substrate; and at least one metal line formed on the first substrate to be overlapped with a portion of the frit, wherein the side of the metal line is bent and formed at a predetermined angle in the intersecting region overlapped with the frit. In other embodiments, in the intersecting region at least one projecting part extended from the side of the metal line is provided. In the intersecting region at least one groove is formed on the side of the metal line.

According to another embodiment of the present invention, the organic light-emitting display device comprises: a first substrate comprising a pixel region wherein a pixel is formed and a non-pixel region excepting the pixel region; a second substrate opposed and bonded to the first substrate in one region comprising the pixel region; sealant positioned between the non-pixel region and the second substrate to bond the first substrate and the second substrate; and at least one metal line formed on the first substrate to be overlapped with a portion of the sealant and formed of at least three layers including different kinds of metals, wherein the metal line comprises at least one groove or projecting part formed from both sides in the intersecting region overlapped with the sealant.

BRIEF DESCRIPTION OF THE DRAWINGS

These and/or other advantages of the invention will become apparent and more readily appreciated from the following description of various embodiments, taken in conjunction with the accompanying drawings.

DETAILED DESCRIPTION OF EMBODIMENTS

Hereinafter, embodiments of the present invention will be described with reference to the accompanying FIG. 1 to FIG. 10E. In the drawings, like reference numerals refer to like elements throughout.

An organic light emitting display (OLED) is a display device comprising an array of organic light emitting diodes. Organic light emitting diodes are solid state devices which include an organic material and are adapted to generate and emit light when appropriate electrical potentials are applied.

Figure 10A:
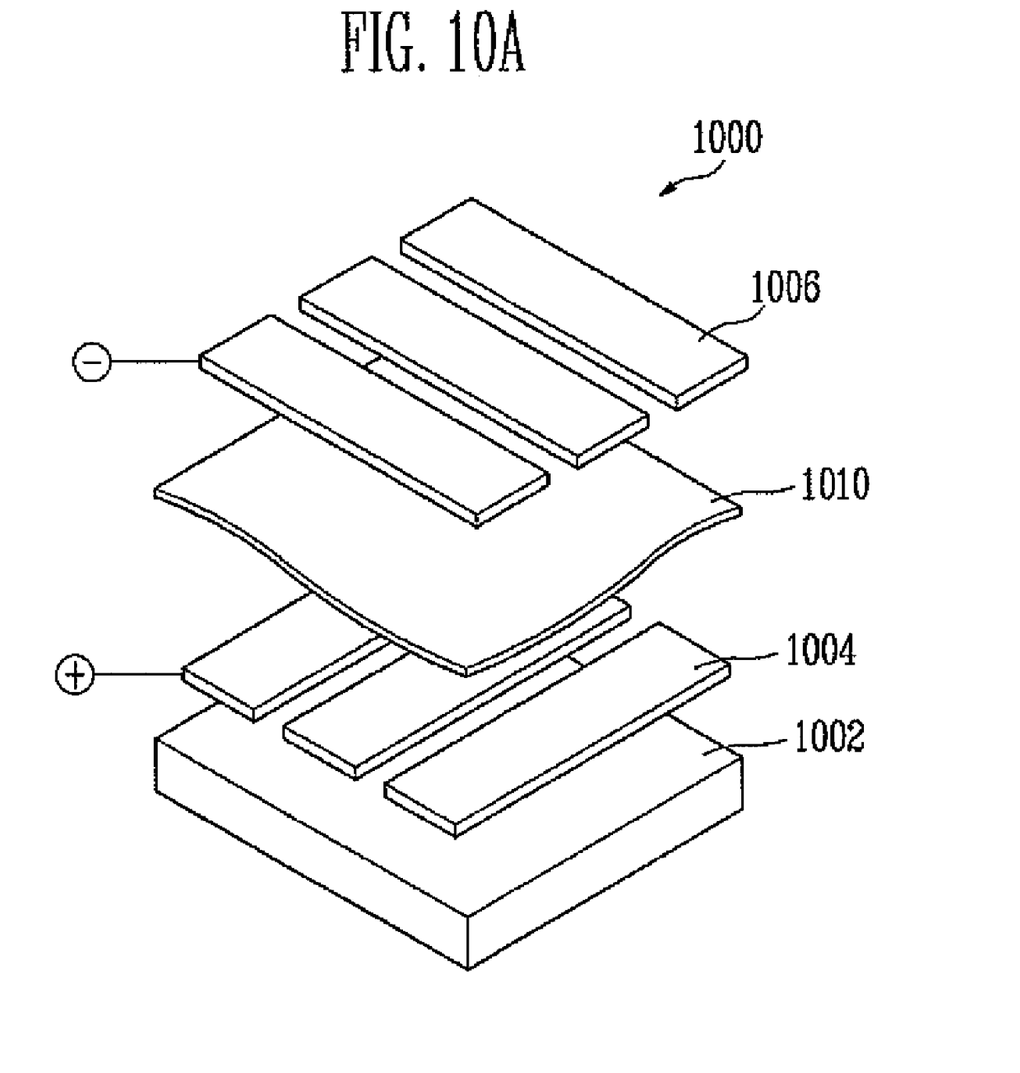
FIG. 10A is a schematic exploded view of a passive matrix type organic light emitting display device in accordance with one embodiment.
Figure 10B:
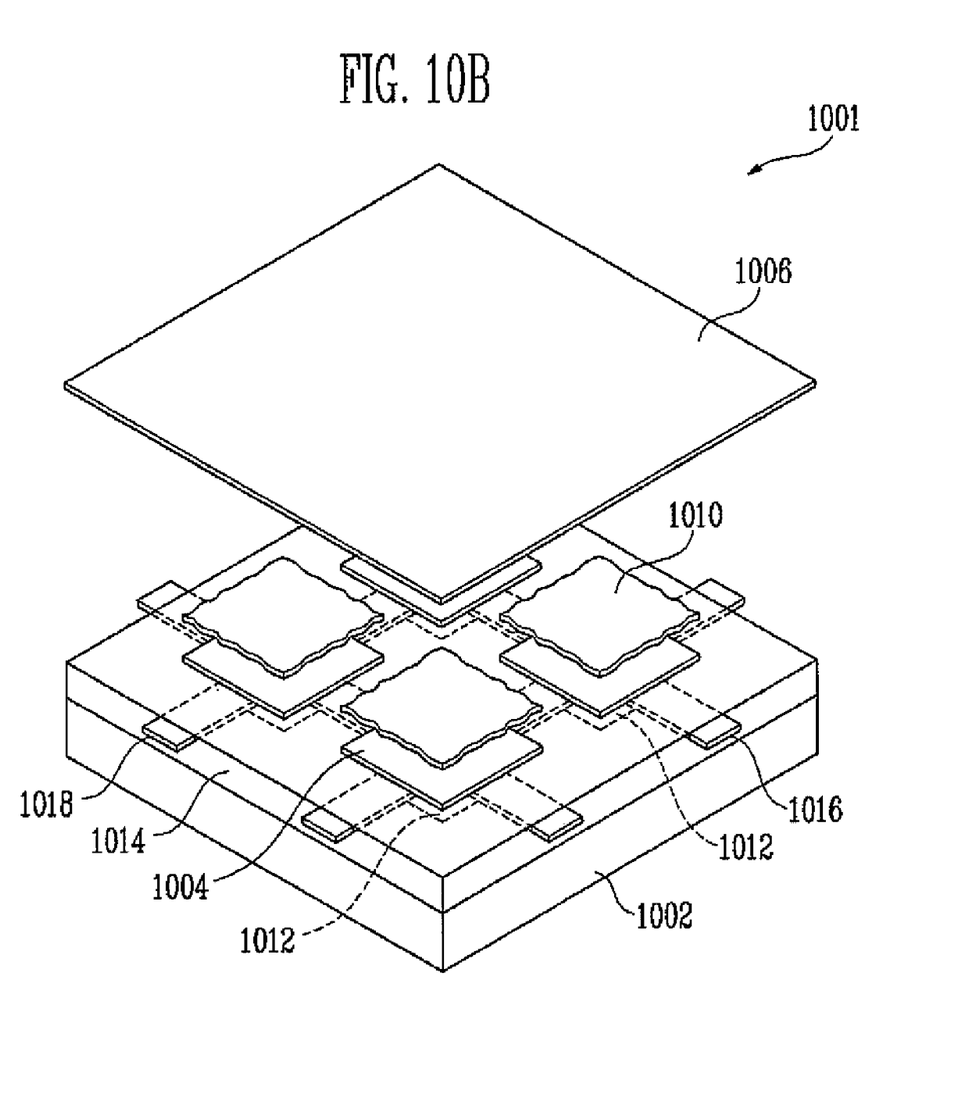
FIG. 10B is a schematic exploded view of an active matrix type organic light emitting display device in accordance with one embodiment.

OLEDs can be generally grouped into two basic types dependent on the arrangement with which the stimulating electrical current is provided. FIG. 10A schematically illustrates an exploded view of a simplified structure of a passive matrix type OLED 1000. FIG. 10B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 10A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 10B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 10C:
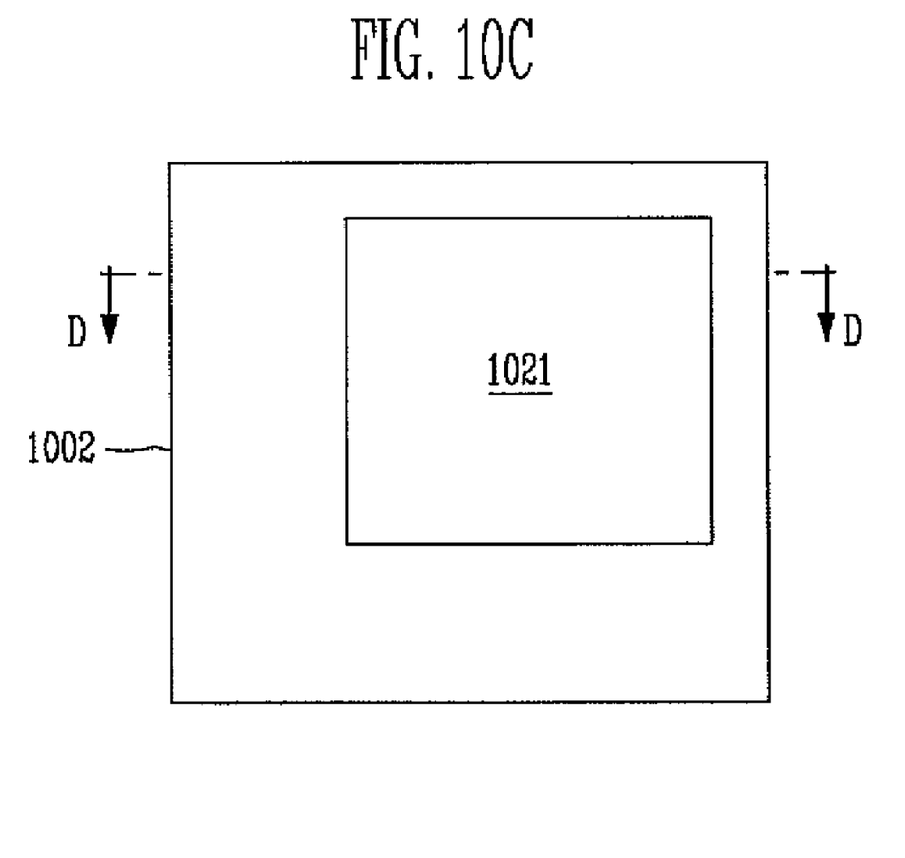
FIG. 10C is a schematic top plan view of an organic light emitting display in accordance with one embodiment.

In many embodiments, an OLED pixel array 1021 comprising a plurality of organic light emitting pixels is arranged over a substrate 1002 as shown in FIG. 10C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 10D:
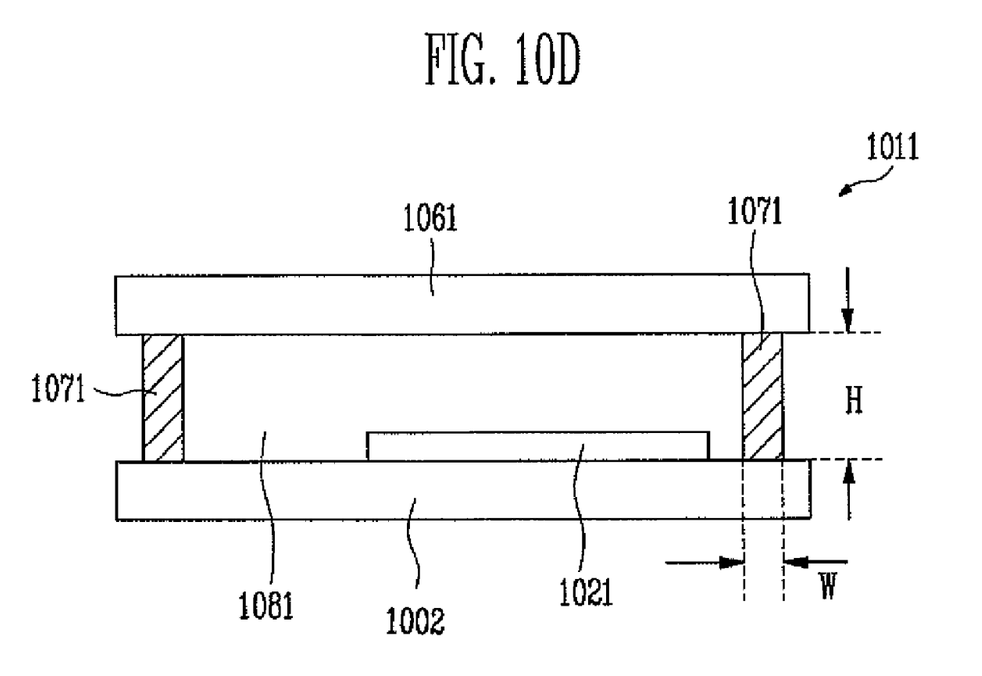
FIG. 10D is a cross-sectional view of the organic light emitting display of FIG. 10C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 10D schematically illustrates a cross-section of an encapsulated OLED device 1011 having a layout of FIG. 10C and taken along the line d-d of FIG. 10C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 10D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 10D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include ZnSiO$_4$, PbTiO$_3$, ZrO$_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % organic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 10E:
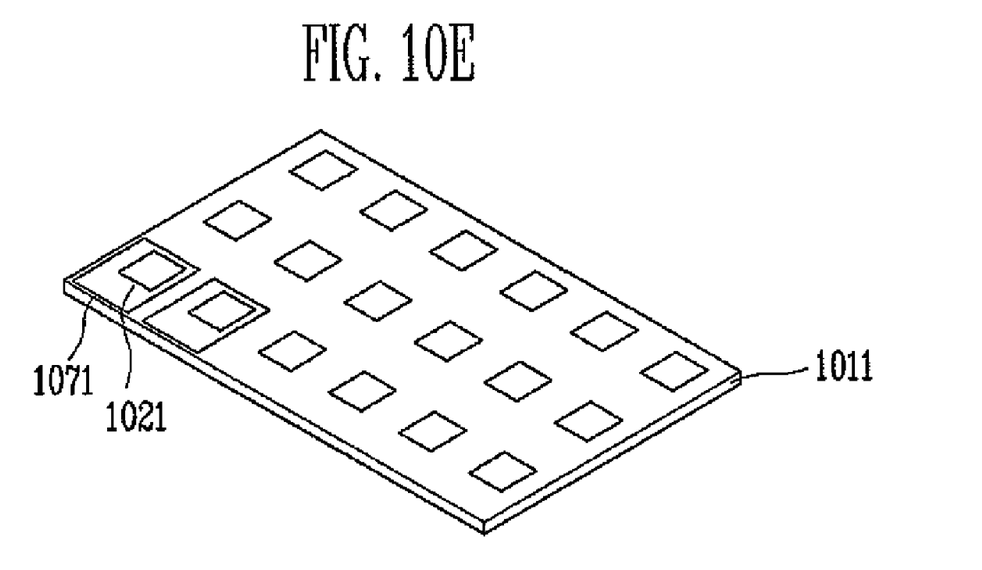
FIG. 10E is a schematic perspective view illustrating mass production of organic light emitting devices in accordance with one embodiment.

In some embodiments, OLED devices 1011 are mass produced. In an embodiment illustrated in FIG. 10E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 10D. In certain embodiments, the individual OLED devices 1011 then further undergo additional packaging operations to further improve the sealing formed by the frit seal 1071 and the top and bottom substrates 1061, 1002.

Figure 1:
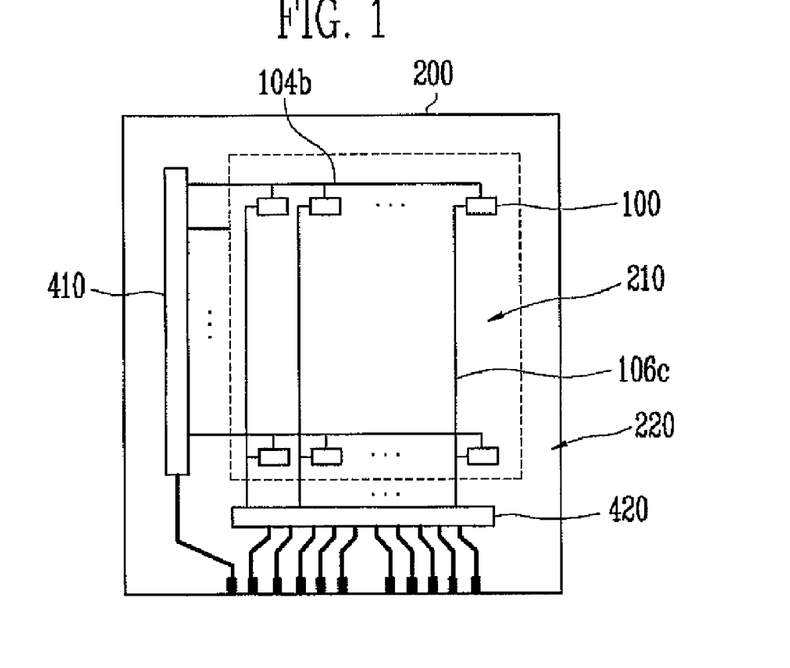
FIG. 1 illustrates a first substrate and an array of organic light-emitting pixels formed on the first substrate according to an embodiment of the present invention.

Referring to FIG. 1, a first substrate 200 is comprised of a pixel region 210 and a non-pixel region 220. The pixel region 210 is provided with a plurality of organic light-emitting pixels, each of which is connected with a scan line 104b and a data line 106c. The non-pixel region 220 is provided with a scan driver 410 connected with the scan lines 104b and a data driver 420 connected with the data lines 106c. The non-pixel region 220 is further provided with a power supplying line (or metal line: not shown) for supplying power to various circuits.

Each pixel comprises an organic light-emitting diode (not shown). In some embodiments, each pixel is connected to at least one thin film transistor for driving the organic light-emitting diode. The organic light-emitting diode comprises an anode electrode, a cathode electrode and organic layers located between the anode and cathode electrodes. The organic layers comprises at least one light-emitting layer and may further comprise one or more of a hole transporting layer, and an electron transporting layer, etc. The thin film transistor comprises a gate electrode, a source electrode and a drain electrode. The transistor controls the amount of current supplied to the organic light-emitting diode. In operation, a pixel 100 is selected when a scan signal and a data signal are applied to that pixel. The selected pixel 100 emits light.

Figure 2A:
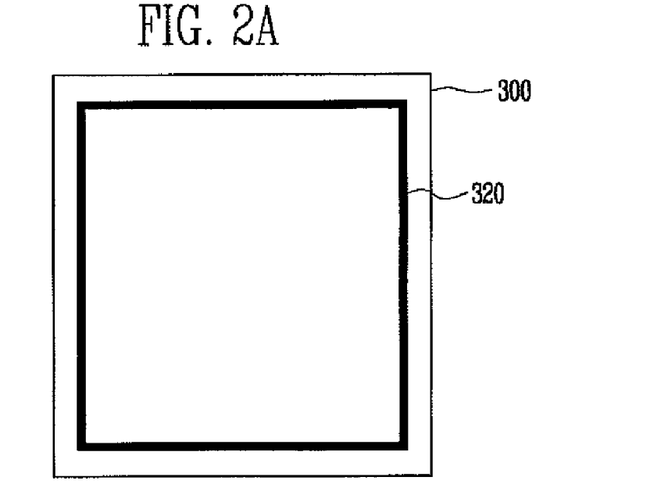
FIG. 2a and FIG. 2b illustrate a second substrate with a frit sealing structure formed thereon.
Figure 2B:
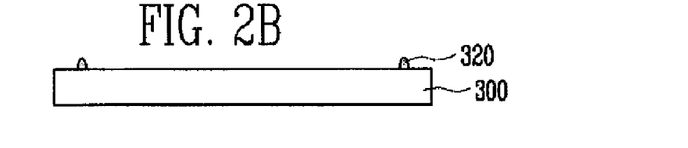

Referring to FIGS. 2a and 2b, the second substrate 300 is provided with a frit 320 that is to bond to the first substrate 200. For example, the frit 320 is formed using a method as described now. In general, the frit in the form of glass powder is produced by rapidly falling temperature in the course of heating glass material at high temperature. The frit power is mixed with organic fillers so as to form a frit paste. The paste is applied onto the second substrate 300 in a desired structure such as shown in FIGS. 2A and 2B. The second substrate 300 and the paste structure are burned at a predetermined temperature so as to cure the frit and fix it to the second substrate 300. Here, the temperature for burning the frit 320 is approximately 300° C. to 500° C. In some embodiments, the frit 320 has the height of about 14 to about 15 μm, and the width of about 0.6 to about 0.7 mm.

Figure 3:
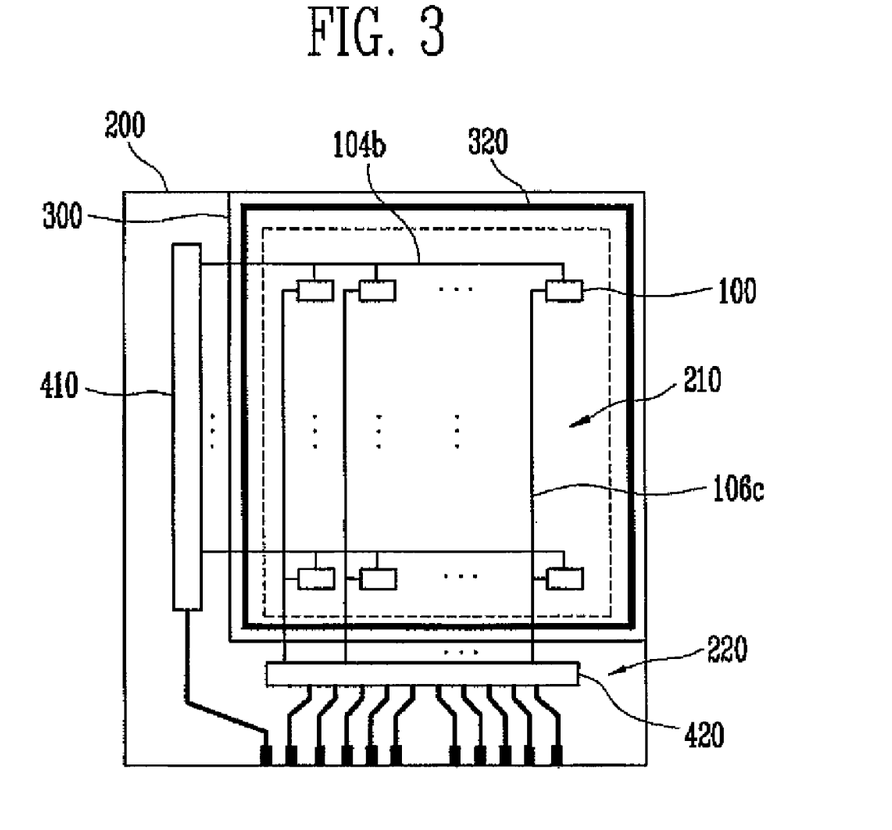
FIG. 3 is a schematic view showing that the first and second substrates are interconnected.

Referring to FIG. 3, the frit 320 is interposed between and bonds the first substrate 200 and the second substrate 300. In embodiments, the frit 320 is irradiated with infrared rays or laser beams so that at least part of the frit 320 is melted and bonded to the first substrate 200, thereby bonding the first substrate and the second substrate. As above, the first substrate 200 and the second substrate 300 are substantially hermetically bonded with the frit 320, thereby preventing oxygen and moisture, etc., from inflicting into the pixel region 210.

Meanwhile, when the first substrate 200 is bonded to the second substrate 300, the frit 320 is overlapped with at least one of electrically conductive lines. For example, the frit 320 is overlapped with electrically conductive lines such as the scan lines 104b, the data lines 106c, the power supply lines, etc. Here, at least some of the electrically conductive lines are formed when the thin film transistors and the organic light-emitting diodes are formed. In some embodiments, the electrically conductive lines are made simultaneously with gate electrodes, source or drain electrodes and anodes for the light-emitting pixels. Therefore, the electrically conductive lines may be in the same materials as those circuit elements. For example, the scan lines 104 are made of the gate metal, and the data lines 106c and the power supply lines can be made of the source/drain metals. In other embodiments, the electrically conductive lines can be made of the same substance as the semiconductor layer of the thin film transistors. In embodiments, the frit 320 can be formed in various sizes and configurations. For example, the frit 320 can surround or exclude the scan driver 410.

Figure 4:
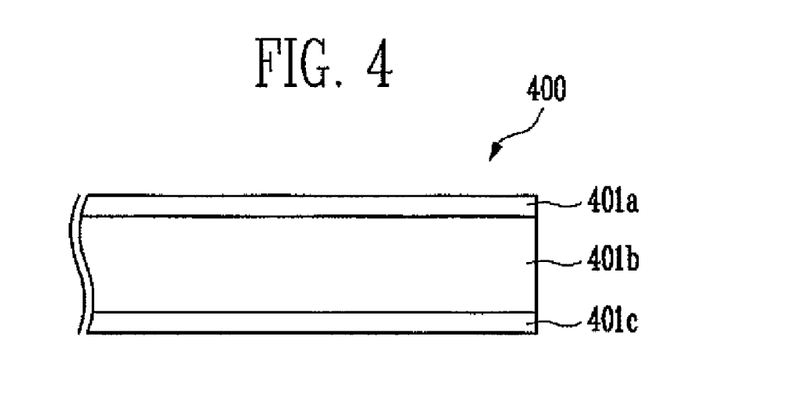
FIG. 4 is a side view showing an electrically conductive line formed on a substrate of an organic light-emitting device.
Figure 5A:
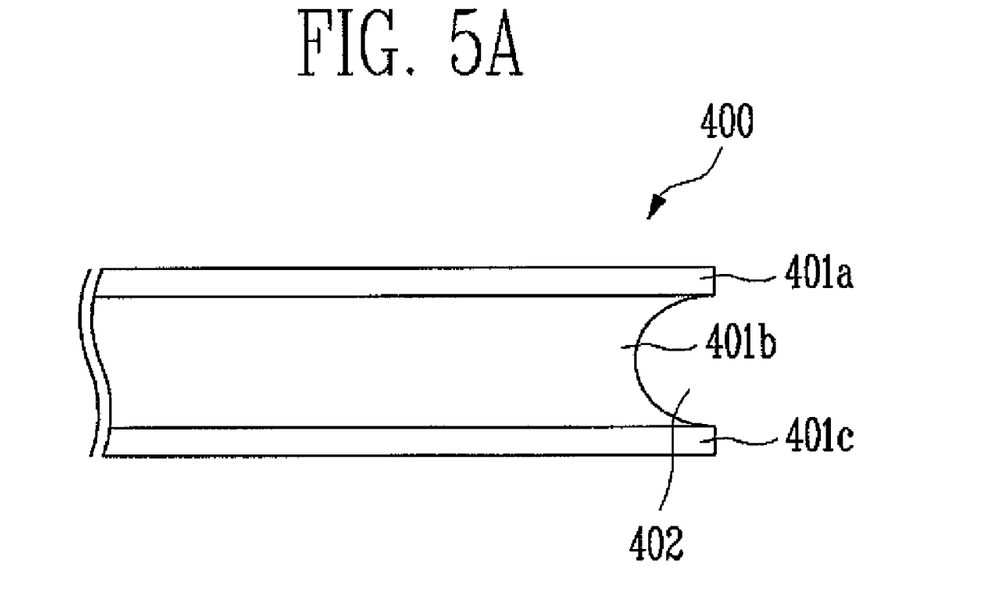
FIG. 5a is a side view of an electrically conductive line formed on a substrate of an organic light-emitting device with a meniscus formed by selective etching.
Figure 5B:
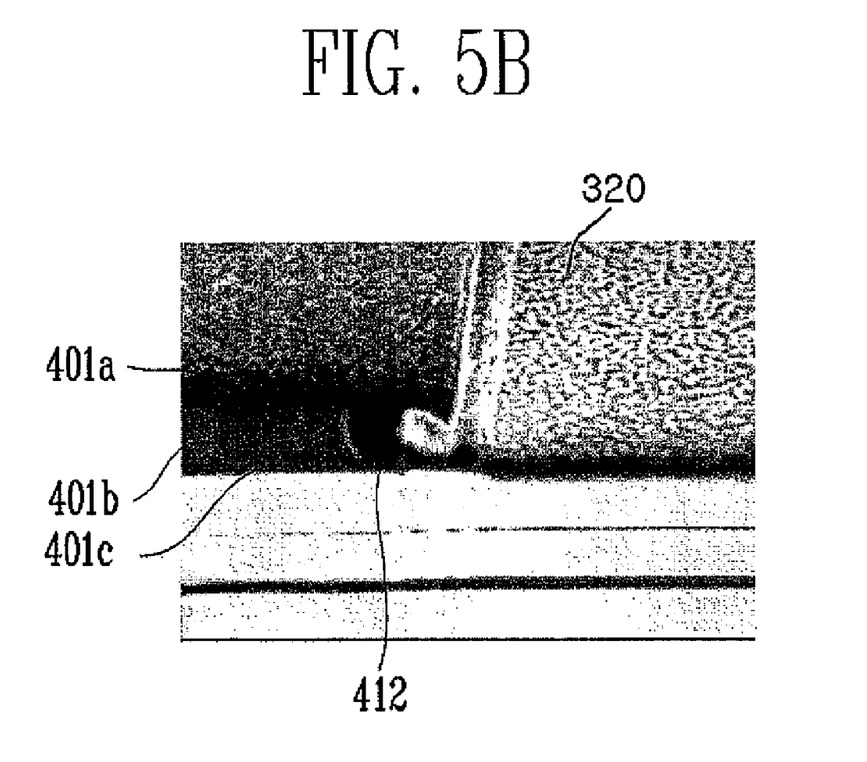
FIG. 5b is a photograph of a cross-section of an area where the electrically conductive line of FIG. 5a is overlapped with a frit seal.

Referring to FIG. 4, the electrically conductive line 400 is manufactured in the form of three layers including different kinds of metal substances. For example, the electrically conductive line 400 comprises a first metal film 401a, a second metal film 401b and a third metal film 401c. In some embodiments, the first metal film 401a and the third metal film 401c are made of the same substances, and the second metal film 401b is made of the substances different from the first metal film 401a and the third metal film 401c. For example, the first film 401a and the third film metal 401c are made of titanium (Ti) or molybdenum (Mo). For example, the second metal film 401b is made of aluminum (Al) having good conductivity. As above, the electrically conductive line 400 is manufactured in the form of three layers, capable of improving the electrical characteristics such as conductivity, etc. Also, the multiple layer construction may minimize unwanted chemical reactions with materials adjacent the conductive line. During the manufacturing of the organic light-emitting display device, the electrically conductive line 400 is subject to at least once or more etching processes. In such etching processes the first metal film 401a and the second metal film 401b made of different metals are etched at different rates. As illustrated in FIG. 5a and FIG. 5b, the second metal film 401b made of aluminum (Al) is more easily etched than the first and third metal films 401a and 401c, thereby forming a meniscus 402 on the side of the electrically conductive line 400. The meniscus 402 viewed from another direction (not illustrated) extends along the conductive line and forms a groove. The terms "meniscus" and "groove' are interchangeably used hereinafter. In particular, as the groove 402 is subject to a washing process after etching, it may become larger.

FIG. 5b illustrates the electrically conductive line with the meniscus 402 in the second metal film 401b along with frit 320 formed over the conductive line. As illustrated, the meniscus 402 and the frit next thereto together form a hole 412, which extends along the extension of the electrically conductive line. This hole may interconnect inside and outside of the space enclosed by the two substrates and the frit, and can provide a channel through which moisture or air can travel. The moisture and/or air reaching the enclosed space may react with materials of important elements of the organic light-emitting device, and may significantly reduce the longevity of the device.

Figure 6:
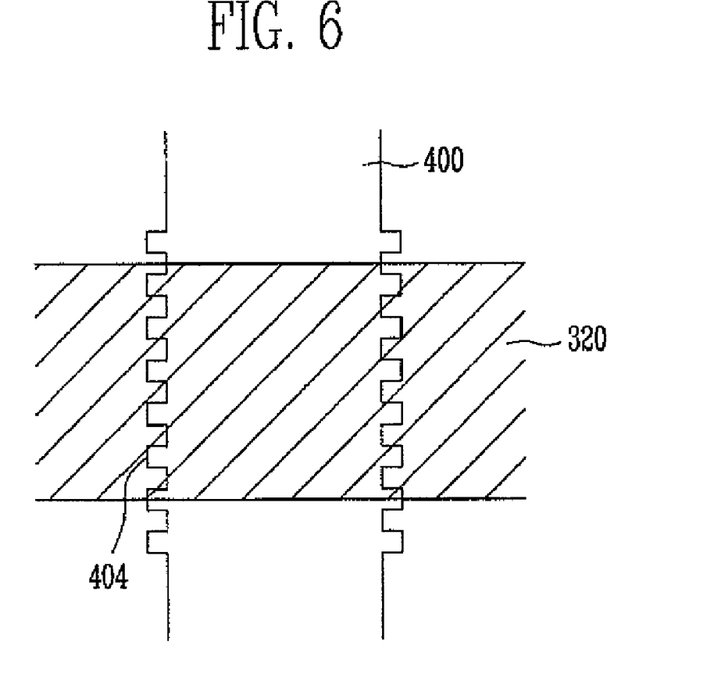
FIG. 6 is a schematic view showing an intersecting region of the frit and the electrically conductive line according to an embodiment of the present invention.

Referring to FIG. 6, the electrically conductive line 400 include certain geometrical structures along both edges of a portion thereof which overlaps with the frit 320. The illustrated geometrical structures comprise protrusions from an otherwise straight edge line of the portion. The adjacent protrusions are separated with an interval such that the geometrical structures are viewed as a plurality of protrusions and a plurality of recesses. Although not illustrated, the electrically conductive line under the geometric structures may still have the meniscus 402 (FIG. 5A) along the edge thereof. Therefore, the meniscus 402 and the frit 320 next thereto may form one or more passages or channels that can allow travel of moisture or air therethrough. In certain embodiments, the geometric structures may be formed only one of the edges. With the foregoing geometric structures, the length of the edges is substantially longer than that without such structures. The longer edges of the conductive line 400 makes the penetration of moisture or air less likely or less severely. This is because the longer the edge is, the longer the channel or passage interconnecting the inside and outside of the frit, if at all. Also, in some situations, the channel or passage may be blocked by a portion of the frit 320 or by collapse of portions of the geometric structures at one or more locations thereof. In such situations, moisture or air may not reach the space enclosed by the two substrates and the frit.

Figure 7A:
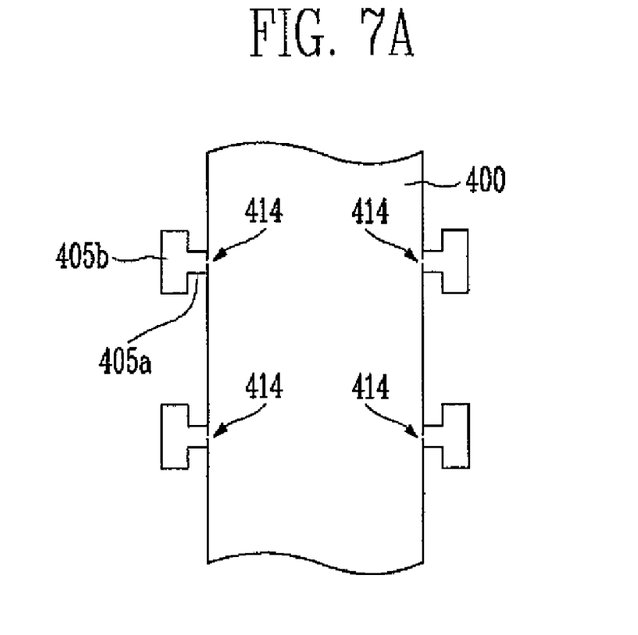
FIGS. 7a, 7b, 8, 9a and 9b illustrate alternative embodiments of electrically conductive lines as illustrated in FIG. 6.

The geometric structures may be formed in various shapes and configurations as long as their existence increases the length of the edges of the conductive line 400 where it overlaps with the frit 320. For example, the geometric structures may be shaped and configured as illustrated in FIG. 7A. The illustrated structures include a protrusion 405a from the main body of the conductive line 400 and an extension 405b contacting the protrusion 405a. The extension 405b extends in a direction along the main body of the conductive line 400 and is longer than the protrusion 405a in that direction. Overall, the length of the edge line of the geometric structures is significantly longer than the length of the otherwise edge 414 of the conductive line without the geometric structures.

Figure 7B:
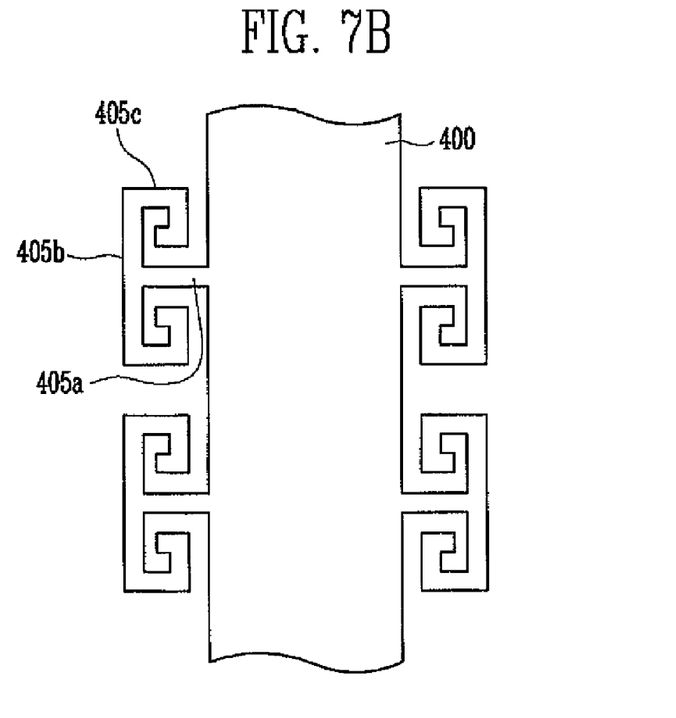

Referring to FIG. 7B, the geometric structures further include portions 405c connected to the extension 405b of FIG. 7A. This additional portions further increase the length of the edge line of the conductive line 400.

The geometric structures formed along the edge of the electrically conductive line may also be used electronic devices other than the organic light-emitting display device. Also, the geometric structures may be used with other forms of sealing of organic light-emitting devices or other electronic devices. Such other forms of sealing include epoxy.

Figure 8:
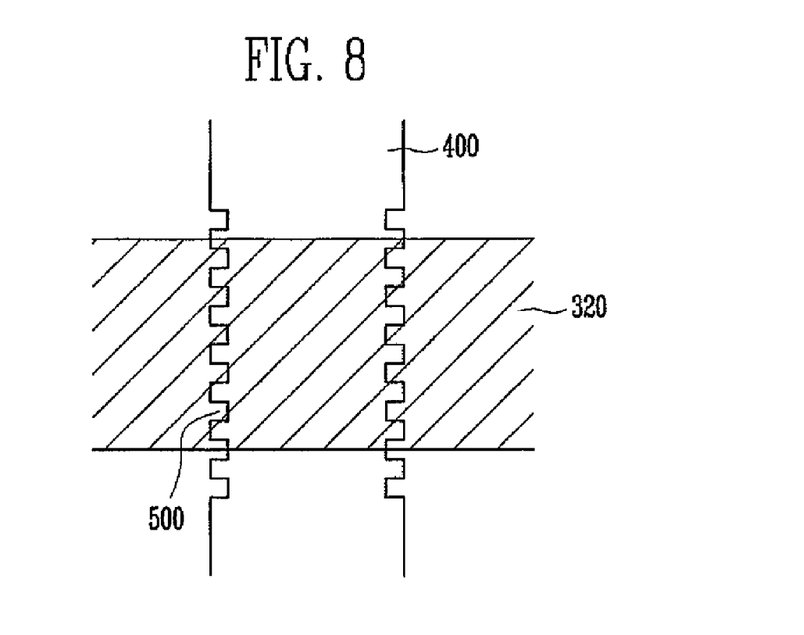
Figure 9A:
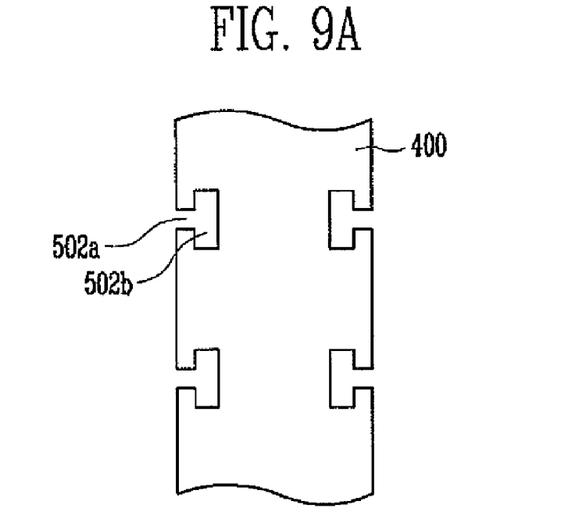
Figure 9B:
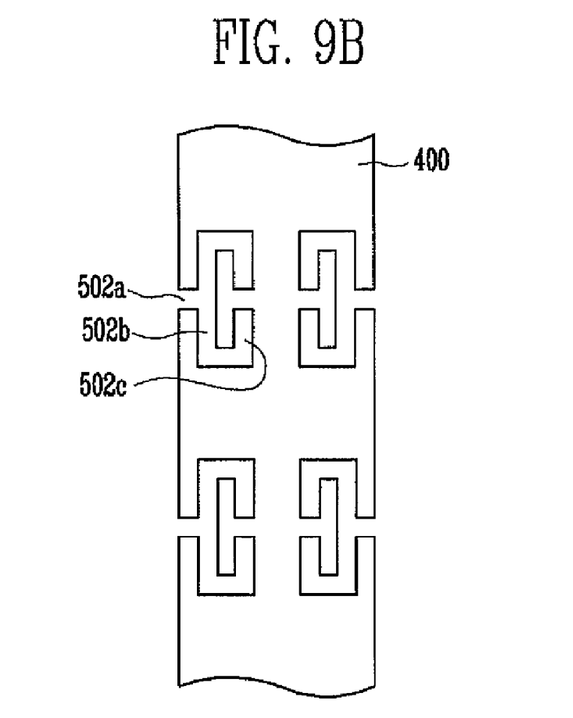

FIGS. 8, 9A and 9B provide additional embodiments of the geometric structures that can be formed along the edges of electrically conductive lines that can be overlapping with frit or other forms of sealing. More specifically, FIG. 8 illustrates the same geometric structures as FIG. 6 with the difference that the recesses of FIG. 8 are formed into the body of the conductive line 400. FIGS. 9A and 9B provides negative geometric structures 502a, 502b, 502c that are formed into the body of the conductive line 400 while lengthening the edge line thereof. In the illustrated embodiments, the electrically conductive line 400 intersects with the frit 320 or other forms of sealing substantially perpendicular to each other. However, in other embodiments, the intersection between the electrically conductive line 400 and the frit 320 may be at other angles.

Although only a few embodiments have been shown and described, one of ordinary skill in the art will appreciate that changes might be made in these embodiments without departing from the principles and spirit of the invention, the scope of which is defined in the claims and their equivalents.

What is claimed is:

1. An organic light-emitting display device comprising:
a first substrate;
a second substrate;
a frit seal interconnecting the first and second substrate; and
an electrically conductive line formed on the first substrate and comprising a portion overlapping with the frit seal, wherein the portion of the electrically conductive line comprises a first edge with geometrical structures such that the length along the first edge with the geometrical structures is substantially longer than that without the geometrical structures, wherein the electrically conductive line comprises a first side surface depending from the first edge, the first side surface comprising a groove extending along at least part of the first edge,
wherein the geometrical structures comprise a protrusion from the first side surface and an extension from the protrusion, and wherein the extension extends in a direction substantially parallel to the portion of the electrically conductive line, wherein the extension is longer than the protrusion in the direction.

2. An organic light-emitting display device comprising:
a first substrate;
a second substrate;
a frit seal interconnecting the first and second substrate; and
an electrically conductive line formed on the first substrate and comprising a portion overlapping with the frit seal, wherein the portion of the electrically conductive line comprises a first edge with geometrical structures such that the length along the first edge with the geometrical structures is substantially longer than that without the geometrical structures, wherein the electrically conductive line comprises a first side surface depending from the first edge, the first side surface comprising a groove extending along at least part of the first edge,
wherein the geometrical structures comprise a recess into the first side surface and a canal extending from the recess, wherein the canal extends in a direction substantially parallel to the portion of the electrically conductive line, wherein the canal is longer than the recess in the direction.

3. The device of claim 1, wherein at least one of the geometrical structures comprises a groove on a side surface thereof.

4. The device of claim 1, wherein the electrically conductive line comprises two or more layers.

5. The device of claim 1, wherein the electrically conductive line comprises an interposed layer interposed between two conductive layers, wherein the groove is formed into the interposed layer.

6. The device of claim 5, wherein each of the two conductive layers comprise a common material.

7. The device of claim 1, wherein the electrically conductive line comprises a layered structure of titanium (Ti)/aluminum (Al)/titanium (Ti) or molybdenum (Mo)/aluminum (Al)/molybdenum (Mo).

8. The device of claim 1, wherein the electrically conductive line does not comprise through holes therein.

9. The device of claim 1, wherein the frit seal contacts at least part of the first side surface.

10. The device of claim 1, wherein the frit seal comprises a portion partly received in the groove.

11. The device of claim 1, wherein the frit seal comprises a portion blocking a portion of the groove.

12. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

13. The device of claim 1, wherein the first substrate, the second substrate and the frit seal define an enclosed space, wherein the electrically conductive line interconnects a first circuit located within the enclosed space and a second circuit located outside the enclosed space.

14. The device of claim 1, wherein the groove extends substantially throughout along the first edge of the portion.

15. The device of claim 1, wherein the groove is a defect, and wherein the frit seal and the groove allow passage of moisture into an enclosed space defined by the first and second substrates and the frit seal and the geometrical structures are configured to compensate for the defect.

16. The device of claim 1, wherein the groove is substantially curved.

17. The device of claim 2, wherein at least one of the geometrical structures comprises a groove on a side surface thereof.

18. The device of claim 2, wherein the electrically conductive line comprises two or more layers.

19. The device of claim 2, wherein the electrically conductive line comprises an interposed layer interposed between two conductive layers, wherein the groove is formed into the interposed layer.

20. The device of claim 2, wherein the frit seal contacts at least part of the first side surface.

21. The device of claim 2, wherein the frit seal comprises a portion partly received in the groove.

22. The device of claim 2, wherein the first substrate, the second substrate and the frit seal define an enclosed space, wherein the electrically conductive line interconnects a first circuit located within the enclosed space and a second circuit located outside the enclosed space.

23. The device of claim 2, wherein the groove is a defect, and wherein the frit seal and the groove allow passage of moisture into an enclosed space defined by the first and second substrates and the frit seal and the geometrical structures are configured to compensate for the defect.

* * * * *